United States Patent [19]
Dell et al.

[11] Patent Number: 6,097,883
[45] Date of Patent: Aug. 1, 2000

[54] DUAL STATE MEMORY CARD HAVING COMBINED AND SINGLE CIRCUIT OPERATION

[75] Inventors: Timothy Jay Dell, Colchester; Mark William Kellogg; Bruce Gerard Hazelzet, both of Essex Junction, all of Vt.

[73] Assignee: International Business Machines Corporation, Armonk, N.Y.

[21] Appl. No.: 08/889,263

[22] Filed: Jul. 8, 1997

[51] Int. Cl.$^7$ ........................................................ G06F 13/00
[52] U.S. Cl. ................ 395/282; 395/281; 361/684; 361/679; 361/728; 361/736; 361/737; 361/760; 361/785; 439/59; 439/61; 439/626; 439/629; 439/636; 439/639; 439/637
[58] Field of Search ........................... 361/728, 679, 361/684, 736, 737, 760, 785; 439/59, 61, 637, 636, 626, 629; 395/281, 282

[56] References Cited

U.S. PATENT DOCUMENTS

| | | | |
|---|---|---|---|
| 5,189,598 | 2/1993 | Bolan et al. | 361/397 |
| 5,287,460 | 2/1994 | Olsen et al. | 395/275 |
| 5,289,339 | 2/1994 | Akashi et al. | 361/684 |
| 5,748,912 | 5/1998 | Lee | 395/282 |

*Primary Examiner*—Ayaz R. Sheikh
*Assistant Examiner*—Frantz Blanchard Jean
*Attorney, Agent, or Firm*—Thornton & Thornton; David R. Thornton; Robert A. Walsh

[57] ABSTRACT

A printed circuit card having first and second circuit units mounted thereon in connection to terminal pads adjacent two card edges, with the first and second circuit units being in connection to each other and to select pads of a first edge such that upon insertion of that edge into a given card socket, both circuit units are enabled, and the circuit units also being in connection to the pads of a second edge such that upon insertion of that edge into a second card socket, only the second circuit unit is enabled. In the preferred embodiment, the card is a memory module card having buffer and memory circuit units designed to cooperate with each other and with either of standard, buffered or unbuffered memory card sockets in a system board in accordance with insertion of a first or second pad edge in one of the card sockets to automatically provide, either combined circuit unit operation, or single circuit operation. The invention is also applicable to clocked register circuits and series pass devices.

24 Claims, 4 Drawing Sheets

DUAL STATE MEMORY CARD HAVING COMBINED AND SINGLE CIRCUIT OPERATION

FIELD OF THE INVENTION

The invention related generally to computer memory modules, and more particularly to a computer memory module that can be operated in either a buffered or an unbuffered mode without requiring switching circuitry therein.

BACKGROUND OF THE INVENTION

Computers use numerous memory units such as Dynamic Random Access Memory units (DRAM)s for the storage of and retrieval of data. Initially computers used individual memory units mounted directly onto the computers main board generally known as the mother board or system board. As computers increased in size and complexity, they required more and more memory and the system boards could not accommodate a sufficient number of individual memory units. An early solution to this problem was to create a memory module, known as Single In-line Memory Module (SIMM), that was formed of a plurality of individual memory units arranged in banks and mounted on a card in electrical connection to terminal pads displayed adjacent a longitudinal edge of the card.

Still higher memory demands in the systems were met by the development of the so-called Dual In-line Memory Modules (DIMMs) having individual memory units mounted on a card in electrical connection to terminal pads displayed adjacent both sides of the pad edge to thereby accommodate increased memory units.

As computers continued to increase in complexity, additional needs such as higher speeds, greater loading and more compact board design were required. With these additional needs, some computer designs required buffers in the memory modules to recondition the computer's data or signal lines, so as to secure proper functioning of the DRAMs. To assure that systems requiring buffered modules could only be supplied with a buffered module, the modules and their respective adapter sockets, were keyed to accept only the correct type of module card. That is, to accept only buffered modules without accepting unbuffered modules or vice versa.

Because of the wide variety in computer needs, it is not uncommon for manufacturers to design some computers that require buffered modules and other computers that do not, which requires that the manufacture stock different parts to provide both buffered and unbuffered modules. In turn, as the number of required parts increase, inventory and tracking problems also increase. Moreover multiple parts, especially when similar, can cause confusion during both manufacture of the initial computer and repair of the computer in the field.

SUMMARY OF THE INVENTION

Broadly, the invention comprises a system having a system board and a dual state circuit card configured to be inserted in one or another sockets of the board in a first or a second edge orientation which will provide either dual circuit operation or single circuit operation. The circuit card comprises a dual state card having first and second circuit units mounted on the card body in connection to each other and select pads of a first edge such that, upon insertion of that edge into one select card socket, the first and second circuit units are enabled for combined operation, and at least the second circuit unit is also connected to select pads mounted on a second card edge such that, upon insertion of that edge into another select card socket, the second circuit unit alone is enabled.

Further, the first circuit unit is also connected to the second card edge such that, upon insertion of that edge into the other card socket, the first circuit unit is disabled.

In the preferred embodiment, the invention comprises a circuit arrangement providing a dual state, buffered memory circuit designed for, and incorporated in, a Dual In-line Memory Module or DIMM: The module is provided on a circuit card having edge connectors or pads along both top and bottom longitudinal edges of the card which will, when properly positioned in select board sockets, enable or disenable a buffer portion of the module to provide buffered or unbuffered memory operation.

To control insertion of the card in a correct orientation in a select socket, the card is provided with appropriately positioned keying elements which are complementary to the keying elements of prior art sockets to thereby permit the novel card to be inserted into the standard socket only in the required direction, i.e. as a buffered or unbuffered card.

Thus, the present invention results in an improved memory module card in which different circuits, such as buffered and unbuffered memory modules, are made available on a single card.

Accordingly, it is an object of the invention to provide a memory module card having dual circuit configurations.

Another object of the present invention is to provide a memory module card which provides a different circuit configuration depending on the direction of insertion in the card socket of a system board.

Still another object of the invention is to provide a memory module card which can be used in both buffered and unbuffered memory systems.

Another object of the invention is to provide a dual circuit memory module card providing different circuit combinations of sole operation of one circuit and combined operation of both depending upon the direction of insertion in the card socket of a system board.

A further object of the present invention is to provide a memory card configured for insertion into either of the standard, buffered or unbuffered adapter sockets presently available for enabling memory systems.

A still further object of the invention is to provide a memory module circuit card which provides a buffered or unbuffered configuration depending on the direction of insertion of the card in standard card sockets.

These and other objects and features of the present invention will become further apparent from the following description taken in conjunction with the drawings.

DESCRIPTION OF THE PREFERRED EMBODIMENT

Figure 1:
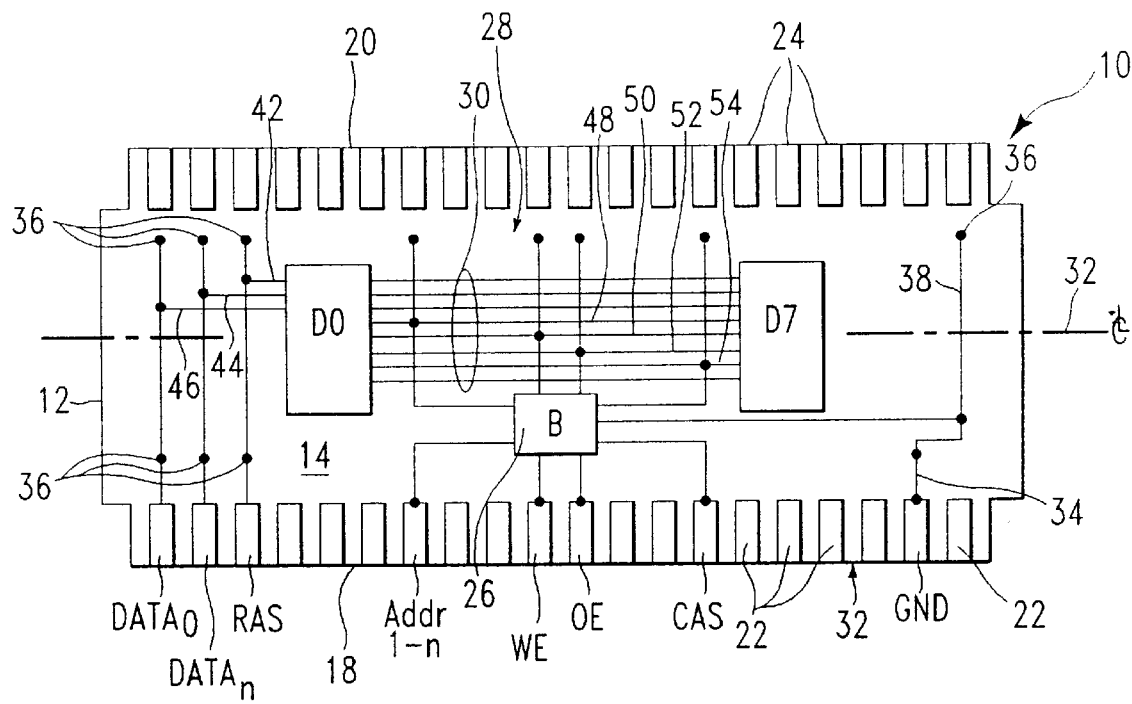
FIG. 1 is a plan view, schematically illustrating a front face of a DIMM type memory card incorporating the dual state features of the present invention which provide buffered and unbuffered memory states.
Figure 2:
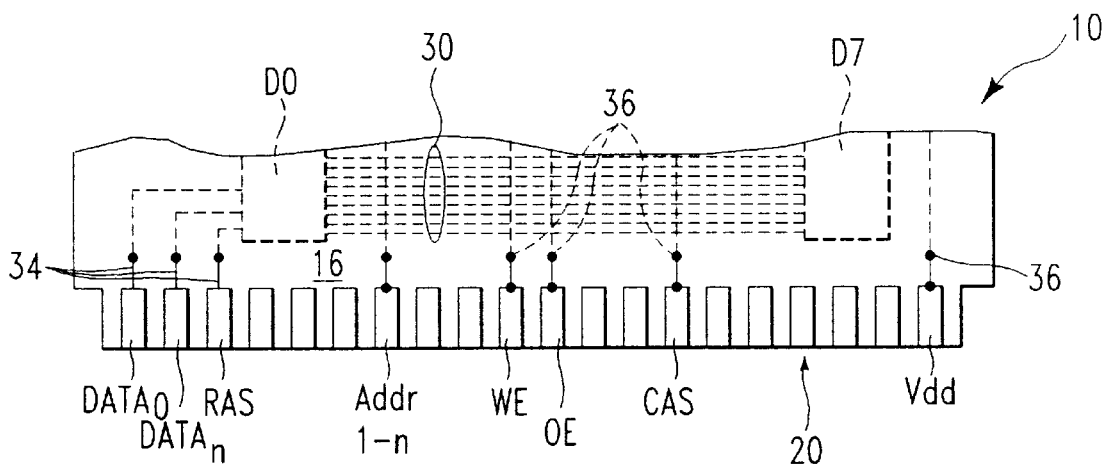
FIG. 2 illustrates a top edge portion of the rear face of the card shown in FIG. 1.
Figure 3:
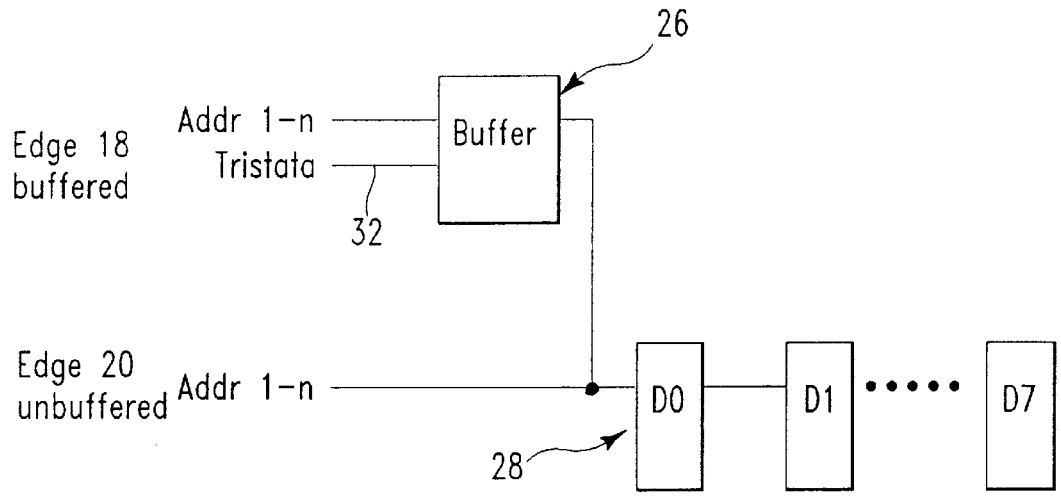
FIG. 3 is a block diagram of select circuit units of FIGS. 1 and 2, illustrating their dual circuit states.

Referring now to FIGS. 1, 2 and 3 the present invention will now be described.

FIG. 1 is plan view, schematically illustrating a DIMM type printed circuit card 10 having a card body 12, formed in a conventional manner of insulating material, and having a major front surface 14 and rear surface 16. Arranged along first and second longitudinal edges 18 and 20 on both the front and rear surfaces 14, 16, are a plurality of electrical I/O terminals, or pads 22 and 24 positioned adjacent the edges 18, 20.

Carried on the front face 14 are two circuit units, namely, a buffer circuit 26 and a memory circuit 28. These circuit units 26, 28 are mounted on the card 10 in electrical connection to each other end select ones of the pads 22, 24 along card edges 18, 20 so that one or both of these circuit units will be rendered operational in accordance with the particular edge of the card which is enabled by an appropriate board socket.

In the illustrated embodiment, the ordinary circuit 28 comprises eight memory devices such as DRAMs, only a few which are shown in FIGS. 1 and 2, as D0, D1 and D7. These DRAMs D0–D7 are connected in parallel by a group of wires, or conductors 30 with select pads of both the first and second edges 18, 20. In turn, the buffer circuit 26 is connected directly to the first edge 18 and to the conductors 30 of the memory circuit 26 to form a cooperative wiring pattern, as will be subsequently explained in more detail.

The circuit units 26 and 28 are conventional buffer and memory DRAM circuits, respectively, which are intended for operation in a conventional manner in accordance with standard electrical circuit board configuration. To this end, the edge 18 is designed to fit a standard buffered DIMM memory socket and the edge 20 designed to fit a standard unbuffered memory socket, as later explained.

The buffer unit 26 and memory unit 28 are connected to each other and select ones of pads 22 and 24 so that when edge 18 is inserted into a prior art socket designed for a buffered memory card, both the buffer unit 26 and the memory unit 28 are energized to provide buffered memory operations, and conversely, when edge 20 is inserted into a prior art socket designed for an unbuffered memory card, only the memory unit 28 is energized to provide unbuffered memory operations, and the buffer unit 26 is disabled.

Hence, the edge 18 can be considered the buffered memory edge intended to enable combined operation of both circuit units 26, 28, whereas the edge 20 can be considered to be the unbuffered memory edge intended to enable only the memory circuit 28, and thus, the card 10 is designed with a first edge 18 configured for insertion in and operation by a standard, buffered memory socket, wired to the system board for operating prior art buffered memory cards, and a second edge 20 configured for insertion in and operation by a standard, unbuffered memory socket, which is wired to the system board for operating conventional, unbuffered memory cards of the prior art.

The card 10 utilizes a DIMM type card arrangement wherein each individual pad adjacent a given edge and on a given face of the card are respectively connected to its counterpart adjacent that edge on the opposed face of the card. Thus, to facilitate enabling of the different states of the card 10 by either of the presently available buffered or unbuffered DIMM sockets, the circuit units 26, 28 are connected to designated pads on the edges 18 and 20 so that when the card 10 is rotated around its longitudinal axis 32 to direct the edge 20 downwardly into the orientation shown in FIG. 2, the circuit connections to the rear pads 34 adjacent the edge 20 will be appropriate to operate the desired circuits. That means, the pads adjacent edge 20 may be connected to the circuit units 26, 28 in a slightly different order than the way the pads on edge 18 in FIG. 1 are connected.

As illustrated, one arrangement for accomplishing this connection between front and rear pads along each edge is to connect these pads together by means of short conductors 34 which extend a short distance from each pad to vias 36 which extend from the front face 14 to the rear face 16 as seen in FIGS. 1 and 2. Of course, many other arrangements will be suitable for this interconnection, for example, connection of the tabs at the card edge.

Figure 4:
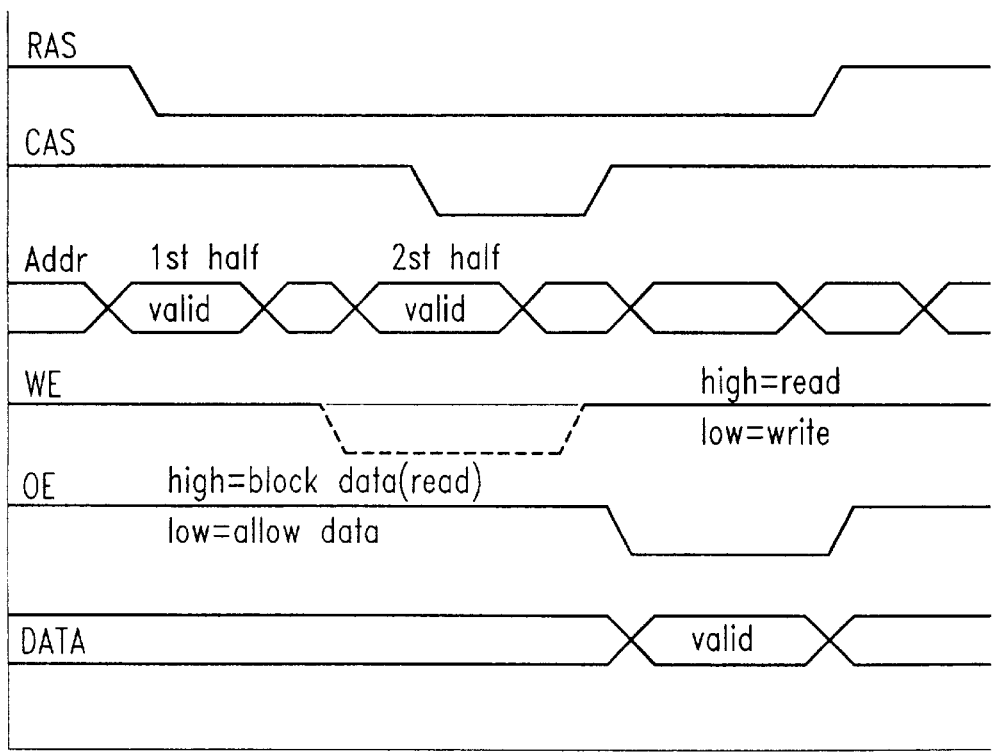
FIG. 4 illustrates a timing diagram of typical signals to be applied to circuit units of the preferred embodiment.

To facilitate an understanding of the circuit operations, a number of the pads adjacent the edge 18 and adjacent the edge 20 are labeled in FIGS. 1 and 2 in accordance with the signals to be placed thereon by a system board when the edges 18 or 20 are respectively inserted in appropriate sockets. Typical curves of these drive signals, are graphically displayed in FIG. 4, and are defined as signals wherein:

RAS is the Row Address Strobe;
Addr is the Address signal;
OE is the Output Enable signal;
WE is the Write signal;
DATAo and DATAn are bi-directional input/output pads;
CAS is the Column Address Strobe;

In addition, to those set forth in FIG. 4 there are other required pads such as the pads labeled GND which is the system ground pad and Vdd which is the system voltage pad.

Prior to describing the details of the illustrated wiring pattern, it should be noted that, while not shown, the units 26, 28 are also energized in a conventional manner by appropriate connection to Vdd and ground pads of the card edges. Further, the buffer unit 26 is a tristate unit having a tristate lead 38 connected in parallel to both a ground pad (GND) of edge 18 and to a voltage pad (Vdd) on edge 20. It should be noted that these GND and Vdd pads are not connected to the module power plane but serve only to enable/disable the tri-state device, i.e., the buffer unit 26.

In this embodiment, the buffer unit 26 is designed to be enabled when the tristate lead is grounded and disabled when this lead is at Vdd. Thus, the buffer 26 will be enabled when the edge 18 is energized, since the tristate lead is grounded, and disabled when the edge 20 is energized, since the lead 32 is then at system voltage, namely Vdd.

As illustrated in FIGS. 1, 2 and 3, the conductors 30 which connect the DRAMs together to form the memory unit 28, include seven conductors designated 42 to 54. Of these, the conductors 42, 44, and 46 are connected in parallel to the select ones of the pads 20, designated RAS, DATAn and DATAo at edge 18, and to similarly designated pads of edge 20. This wiring pattern provides the Bi-directional Data bits and the Row Address strobe signal to the memory units D0 to D7 regardless of which card edge is connected to the system board, and as a result, efficiently connects these particular signals directly to the memory unit 28 since the latter signals require no buffering.

The buffer unit 26 is connected to pads adjacent edge 18 that are designated as Addr 1-n, WE, OE, and CAS, and the tristate lead 38 is connected to a GND pad, or ground pad at that edge i.e., only when the card is installed via edge 18 and this is not connected to the power plane, as noted previously. In turn, the memory unit 28 is connected to the power plane, as noted previously. In turn, the memory unit 28 is connected by leads 48, 50, 52, and 54 to the pads at edge 20 similarly designated as Addr1-n, WE, OE, and CAS. Finally, the tristate lead 38 is also connected to a Vdd pad, or system voltage pad, adjacent edge 20 i.e., only when the card is installed via edge 18 and this is not connected to the power plane, as noted previously.

Hence, when edge 18 is inserted in a buffered memory socket, the DATAo, DATAn, and RAS signals are fed directly to the memory unit 28 while the Addr1-n, WE, OE, and CAS signals are buffered by the unit 26, prior to being fed to the memory unit 28. Thus, the buffer and memory units 26, 28 are enable in combination to provide buffered memory. On the other hand, when edge 20 is inserted in an unbuffered memory socket, the DATAo, DATAn, RAS, Addr 1-n, WE, OE, and CAS signals are directly fed to the memory unit 28, and thus only the latter is operated. Further, the buffer unit 26 is disabled in this instance due to Vdd being applied to the tristate lead 38.

Thus, it can be seen that the dual state circuit card of the invention provides first and second circuit units mounted on the card body in connection to each other and to select pads of a first edge such that, upon insertion of that edge into a first card socket of the system board, the first and second circuit unit is also connected to select pads mounted on the second edge such that, upon insertion of that edge into a second card socket, the second circuit unit is enabled. As previously indicated, the order of the signal connections from the units 26, 28 to the signal pads of the first edge 18 are made consistent with the order of signals on the spring contacts of presently available buffered memory sockets. Further, the connections of the circuit units to the second edge 20 are also selected to be consistent with the order of the signals on the spring contacts of presently available, unbuffered memory sockets when the card 10 is rotated 180 degrees around its longitudinal axis 32 for insertion of the edge 20 into the latter socket.

Thus, the wiring pattern of the prior art sockets determines the order of signals applied to the card pads, and the latter, in turn, defines the connections of the circuit units 26, 28 to the pads of each edge of the card 10. However, since the wiring pattern on the card can be designed in many ways, an appropriate order of signal pad connection to edge 20 can also be effectuated by any number of arrangements. Further, it should be understood that variations in the order of the connections to the card edges 18, 20 can also be provided where allowance is made for variation in one or more of the prior art socket designs.

Figure 8:
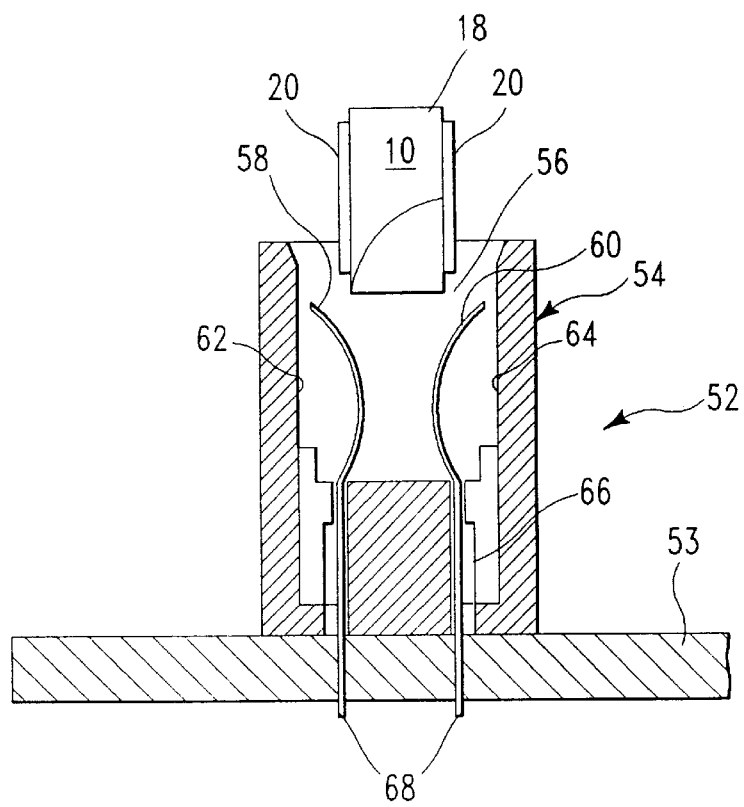
FIG. 8 is an enlarged, cross sectional view illustrating insertion of a tab edge of the card of FIG. 1 into a card socket.

Turning now to FIG. 8, there will be described a conventional buffered memory socket 52, mounted on a system board 53, and adapted for receiving the edge of a conventional circuit card, or the unbuffered memory edge 18 of the card 10, for connection to a system board. This connector socket 52 comprises an elongated housing 54 having a card receiving slot or recess 56 for receiving the edge 18, for example, of the circuit card 10. First and second sets 58 and 60 of spring contacts are positioned along the inner walls 62 and 64 of the recess, respectively. The contacts in each set are longitudinally spaced, or have a pitch that is complementary to the pitch of the pads they are to contact. For example, these sets are adapted for mating with and contacting the pads 20 positioned on the front and rear faces of the card 10.

Each of these contacts are 58, 60 are secured in the socket by suitable means such as barbs 66 which dig into the plastic body of the socket and have extended tails 68 connected in common for further connection to the next higher level of assembly.

As previously noted, to ensure correct positioning of prior art cards (not shown), they are provided with a select keying arrangement positioned for cooperation with buffered or unbuffered sockets. Advantageously, a keying arrangement is provided for the pad edges 18, 20 of the circuit card 10, however for clarity, this keying arrangement is omitted from FIGS. 1 and 2, and is separately illustrated in FIG. 5, wherein a DIMM circuit card 70, constructed in accordance with the invention, is also shown.

In this figure, buffer and memory units are designed in block form at 74 and 76, respectively, with the pads 77 of the lower edge 78 connected by leads (not shown in this figure) to the buffer and memory unit for combined operations, and the pads 79 of the upper edge 80 connected to the memory unit 76 solely for memory operations, all in a manner identical to that described with regard to FIGS. 1–4.

Figure 6:
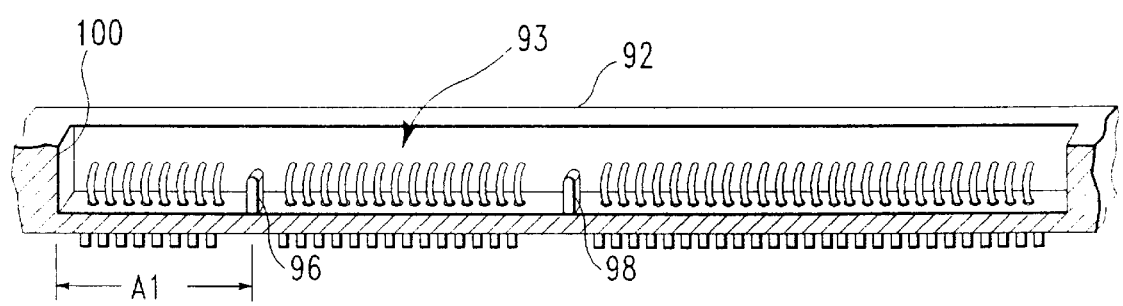
FIG. 6 is a view in section, taken along the longitudinal axis of a prior art system board socket suitable for insertion of a buffered memory module.
Figure 7:
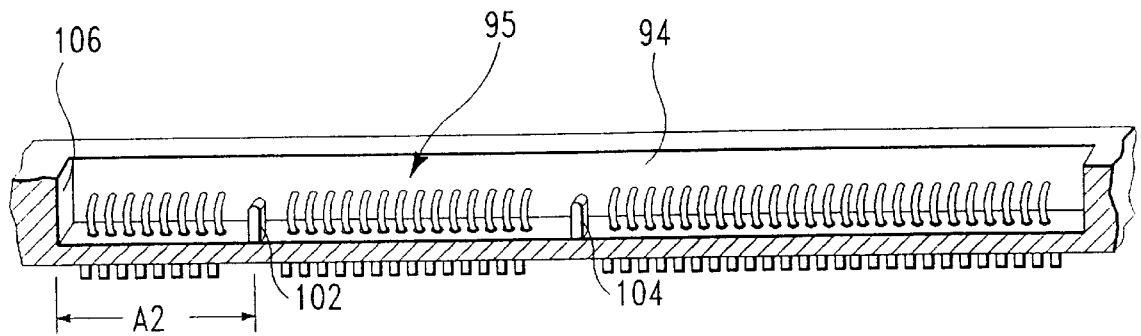
FIG. 7 is a view in section, taken along the longitudinal axis of a prior art system board socket suitable for insertion of an unbuffered memory module.

Hence, the pad edge 78 is the buffer memory edge, designed to enable both the buffer and memory units 74, 76 when this edge is inserted in the buffer socket illustrated in FIG. 6, and the pad edge 80 is the unbuffered memory edge designed to enable the memory unit alone and disable the buffer unit when the latter edge is inserted in the buffer socket illustrated in FIG. 7.

Figure 5:
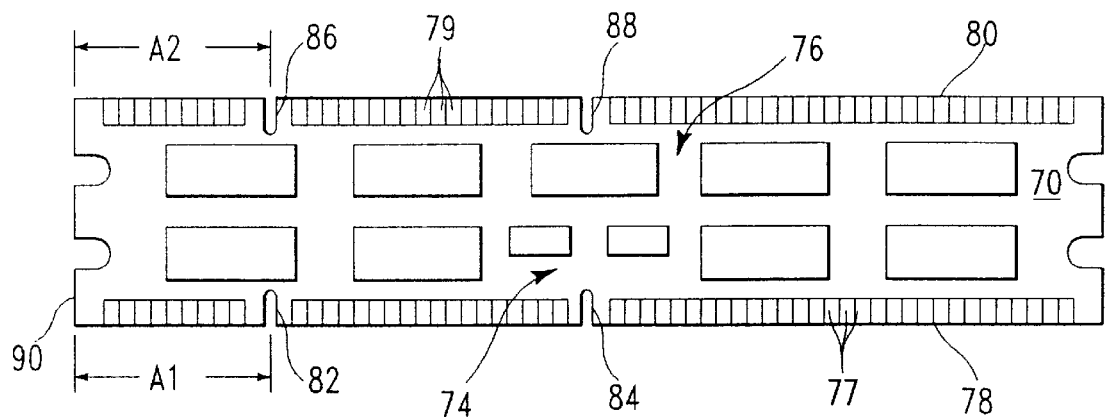
FIG. 5 is a plan view of a DIMM card according to the invention, and illustrating a keying arrangement for the card edges to ensure proper orientation of the card in a selected card socket.

As seen in FIG. 5, a pair of notches or indents 82 and 84 are provided in the pad edge 78 and a similar pair of indents 86 and 88 in the pad edge 80. Each of these indents are positioned at select longitudinal positions along the edges 78 and 80 so as to cooperate with complementary protuberances located within the system sockets as will be later described with regard to FIGS. 6 and 7.

The indents 82 and 86 of the pad edges 78 and 80, respectively, are of particular concern to the present invention since their position from an end edge 90 identifies each of these pad edges as buffered or unbuffered. On the other hand, the position of the indents 84 and 88 are related to socket voltage, and as such are located at the same distance from the end edge 90, since the card 72, as illustrated, is designed for system boards of only one given voltage. Consequently, indent 82 is positioned at a distance A1 from the end edge 90 whereas the indent 86 is positioned at a distance A2 from this end edge.

FIG. 6 illustrates a longitudinal section of the prior art card socket 92 designed for DIMM cards carrying buffered memory circuits whereas FIG. 7 illustrates a prior art card socket 94 designed for DIMM cards which carry unbuffered memory circuits. The card sockets 92 and 94 include spaced apart rows of spring contacts, only one row 93 and 95, respectively, of each being shown in these figures. Both sockets 92 and 94 also carry protuberances, described below, which are complementary to the indents of the pad edges 78 and 80 of the card 72. The socket 92, designed to receive prior art buffered memory cards, carried a pair of protuberances 96 and 98, and as viewed from the end 100 of the socket, the first protuberance 96 is positioned at a distance A1 from this socket end so as to allow reception of prior art cards designed for buffered memory operations and the second protuberance 98 is spaced from this end 106 in accordance with the system voltage so as to only allow reception of cards designed for that given voltage design.

Similarly, the socket 94, designed to receive prior art unbuffered memory cards, carries a pair of protuberances 102 and 104, and as viewed from the end 106 of this socket, the first protuberance 102 is positioned at a distance A2 from the end 106 so as to only allow reception of cards designed for buffered memory operations and the second protuberance 104 is spaced from this end in accordance with system voltage.

Thus, it can be understood that the indents 82 and 84 of the pad edge 78 are made complementary to the protuberances 96, 98 of socket 92, and the indents 86 and 88 of the pad edge 80 are complementary to the protuberances 102, 104 of the socket 94, respectively. Consequently, only the buffered memory edge 78 of the card 90 will be accepted in a buffered memory socket, such as shown in FIG. 6, and only the unbuffered memory edge 80 will be accepted in an unbuffered memory socket such as shown in FIG. 7.

It should also be noted that the position of the voltage related indents 84 and 88 of the card edges 78 and 80 must also be varied where necessary to accommodate system boards (not shown) having different voltages.

Thus, the present invention results in an improved memory module card in which different circuits, such as buffered and unbuffered memory modules, are made available on a single card to decrease the need for creating and maintaining separate, buffered and unbuffered cards and to avoid inventory and tracking problems as well as customer confusion found with the present individual modules.

It should be understood, that the present invention can readily by incorporated in varied circuit cards. Moreover, while the two operational states of the preferred embodiment are described herein as having a first circuit modifying a second, when the first card edge is employed, and with both edges designed for insertion in prior art sockets, other circuits arrangements could be utilized. For example, circuits, other then the described buffer and memory circuits, such as clocked registers or series pass devices could be utilized in the invention.

This completes the description of the preferred embodiment of the invention. Since changes may be made in the above construction without departing from the scope of the invention described herein, it is intended that all the matter contained in the above description or shown in the accompanying drawings shall be interpreted in an illustrative and not in a limiting sense. Thus other alternatives and modifications will now become apparent to those skilled in the art without departing from the spirit and scope of the invention as set forth in the following claims.

What is claimed is:

1. A circuit card for use with system boards having a card socket for receiving the edge of a circuit card and containing a plurality of electrically powered contacts for contacting pads adjacent the received card edge and for enabling circuit units of the card, the circuit card comprising:

a substantially planar card body comprised of insulative material;

a plurality of pads mounted along a first and a second edge of said card; and a first and a second circuit unit mounted on said card body and connected to pads mounted along said first and second edges, said first and second circuit units being connected to pads mounted on said first edge such that upon insertion of said first edge into a first card socket, said first and second circuit units are enabled in combination, and at least said second circuit unit also being connected to the pads mounted on said second edge such that upon insertion of said second edge into a second card socket, said second circuit unit alone is enabled.

2. A circuit card for use with system boards having a card socket for receiving the edge of a circuit card and containing a plurality of electrically powered contacts for contacting pads adjacent the received card edge and for enabling circuit units of the card, the circuit card comprising:

a substantially planar card body comprised of insulative material;

a plurality of pads mounted along a first and a second edge of said card; and a first and a second circuit unit mounted on said card body and connected to pads mounted along said first and second edges, said first and second circuit units being connected to pads mounted on said first edge such that upon insertion of said first edge into a first card socket, said first and second circuit units are enabled, and at least said second circuit unit also being connected to the pads mounted on said second edge such that upon insertion of said second edge into a second card socket, said second circuit unit is enabled; and said first and second circuit units are connected to the pads mounted on said second edge such that upon insertion of said second edge into the second card socket, said second circuit unit is enabled, and said first circuit unit is disabled.

3. The circuit card of claim 2 wherein:

said first and second circuit units are connected together such that said first and second units are enabled in combination from the system board when said first edge is inserted in the first card socket; and said second circuit unit alone is enabled when said second edge is inserted in the second card socket.

4. The circuit card of claim 2 wherein:

said first and second circuit units are connected together such that said first and second units are enabled in combination from the system board when said first edge is inserted in the first card socket; and said second circuit unit is enabled and said first circuit unit disabled when said second edge is inserted in the second card socket.

5. The circuit card of claim 2 wherein:

said first circuit unit is a tristate unit having a tristate lead, and said first circuit unit is enabled when an enabling voltage is applied to said tristate lead and is disabled when a disabling voltage is applied thereto;

said first circuit unit is connected to said first edge to provide said enabling voltage to said tristate lead when said first edge is inserted in the first card socket; and said first circuit unit is connected to said second edge to provide said disabling voltage to said tristate lead when said second edge is inserted in the second card socket.

6. The circuit card of claim 5 wherein:

said enabling voltage is the system ground; and said disabling voltage is a select voltage other than ground.

7. The circuit card of claim 5 wherein:

said tristate lead is connected to a ground pad of said first edge and a power voltage pad of said second edge such that said first circuit unit is enabled when said first edge is inserted in the first card socket and is disabled when said second edge is inserted in the second card socket.

8. The circuit card of claim 1 wherein:

the first and second sockets include tactile discontinuities; and said first and second edges of said circuit card carry tactile discontinuities complementary to those of the first and second card sockets to allow only an appropriate card edge to be inserted in to a given socket.

9. The circuit card of claim 8, wherein:

the first and second sockets include differently positioned protuberances within each socket, respectively; and said first and second edges of said circuit card carry indents positioned on a given card edge in accordance with the position of the protuberance within the socket appropriate for that edge.

10. The circuit card of claim 2 wherein, said first circuit unit is a buffer circuit: and said buffer circuit is connected to said second circuit unit in a configuration such that, when said first edge is inserted in the first card socket, said buffer circuit is directly enabled from the circuit board to buffer signals therefrom and deliver them in a buffered condition to said second circuit.

11. The circuit card of claim 10 wherein;

said first circuit unit is a buffer circuit; and said second circuit unit is a memory circuit and said buffer circuit is connected to said memory circuit in a configuration such that, when said first edge is inserted in the first card socket, said buffer circuit and said memory circuit are enabled in combination, and when said second card edge is inserted in the second card socket, only said memory circuit is enabled.

12. The circuit card of claim 11 wherein:

said buffer circuit is a tristate unit having a tristate lead;

said buffer circuit being configured to be enabled or disabled respectively in accordance with first and second voltage levels applied to said tristate lead;

said tristate lead being connected in parallel to one voltage pad of said first edge and to one voltage pad of said second edge;

said one voltage pad of said first edge being arranged for connection to a first voltage level to enable said buffer circuit when said first edge is inserted in the first card socket of said circuit board; and said one voltage pad of said second edge being arranged for connection to said second voltage level to disable said buffer when said second edge is inserted in the second card socket.

13. The circuit card of claim 12 wherein:

said disabling and enabling voltage levels are ground and Vdd, respectively;

said one voltage pad of said first edge is arranged for connection to ground so as to enable said buffer circuit when said second card edge is inserted in the first card socket; and said one voltage pad of said second edge is arranged for connection to Vdd so as to disable said buffer circuit when said second card edge is inserted in the second card socket.

14. The circuit card of claim 12 wherein:

said second circuit unit is a memory circuit;

said buffer circuit is connected to said memory circuit on said card such that said memory unit is enabled, at least in part, through said buffer circuit when said first edge is inserted in the first card socket; and said memory circuit unit is enabled directly from the circuit board when said second card edge is inserted in the second card socket.

15. The circuit card of claim 2 wherein:

said first circuit unit is a clocked register circuit; and said clocked register circuit is connected to said second circuit unit in a configuration such that, when said first edge is inserted in the first card socket, said clocked register circuit is directly enabled from the circuit board to transmit signals therefrom and deliver them to said second circuit.

16. The circuit card of claim 2 wherein:

said first circuit unit is a series pass circuit; and said series pass circuit is connected to said second circuit unit in a configuration such that, when said first edge is inserted in the first card socket, said series pass circuit is directly enabled from the circuit board to transmit signals therefrom and deliver them to said second circuit.

17. A circuit system board comprising:

a printed circuit board;

a card socket for receiving an edge of a circuit card and containing a plurality of electrically powered contacts for contacting the pads on the received edge of the circuit card and for enabling circuit units thereon; and a circuit card comprising:

a substantially planar card body comprised of insulative material;

a plurality of pads mounted along a first and a second edge of said card; and a first and a second circuit unit mounted on said card body and connected to pads mounted along said first and second edges, said first and second circuit units being connected to pads mounted on said first edge such that upon insertion of said first edge into a first card socket, said first and second circuit units are enabled in combination, and at least said second circuit unit also being connected to the pads mounted on said second edge such that upon insertion of said second edge into a second card socket, said second circuit unit alone is enabled.

18. A circuit system board comprising:

a printed circuit board;

a card socket for receiving an edge of a circuit card and containing a plurality of electrically powered contacts for contacting the pads on the received edge of the circuit card and for enabling circuit units thereon; and a circuit card comprising:

a substantially planar card body comprised of insulative material;

a plurality of pads mounted along a first and a second edge of said card; and a first and a second circuit unit mounted on said card body and connected to pads mounted along said first and second edges, said first and second circuit units being connected to pads mounted on said first edge such that upon insertion of said first edge into a first card socket, said first and second circuit units are enabled, and at least said second circuit unit also being connected to the pads mounted on said second edge such that upon insertion of said second edge into a second card socket, said second circuit unit is enabled; and said first and second circuit units are connected to pads mounted on said second edge such that upon insertion of said second edge into the second card socket, said second circuit unit is enabled, and said first circuit unit is disabled.

19. The circuit card of claim 18 wherein:

said first circuit unit is a buffer circuit; and said second circuit unit is a memory circuit;

said buffer circuit is connected to said second circuit unit in a configuration such that, when said first edge is inserted in the first card socket, said buffer circuit and said memory circuit are enabled in combination, and when said second card edge is inserted in the second card socket, only said memory circuit is enabled.

20. The circuit card of claim 19 wherein:

said buffer circuit is a tristate unit having a tristate lead;

said buffer circuit being configured to be enabled or disabled respectively in accordance with first and second voltage levels applied to said tristate lead;

said tristate lead being connected in parallel to one voltage pad of said first edge and to one voltage pad of said second edge;

said one voltage pad of said first edge being arranged for connection to a first voltage level to enable said buffer circuit when said first edge is inserted in the first card socket of said circuit board; and said one voltage pad of said second edge being arranged for connection to said second voltage level to disable said buffer when said second edge is inserted in the second card socket.

21. In a computer having a system board having a card socket for receiving the edge of a circuit card and containing a plurality of electrically powered contacts for contacting pads adjacent the received card edge and for enabling circuit units of the card;

a circuit card mounted on said system board comprising:

a substantially planar card body comprised of insulative material;

a plurality of pads mounted along a first and a second edge of said card; and a first and a second circuit unit mounted on said card body and connected to pads mounted along said first and second edges, said first and second circuit units being connected to pads mounted on said first edge such that upon insertion of said first edge into a first card socket, said first and second circuit units are enabled in combination, and at least said second circuit unit also being connected to the pads mounted on said second edge such that upon insertion of said second edge into a second card socket, said second circuit unit alone is enabled.

22. In a computer having a system board having a card socket for receiving the edge of a circuit card and containing a plurality of electrically powered contacts for contacting pads adjacent the received card edge and for enabling circuit units of the card;

a circuit card mounted on said system board comprising:

a substantially planar card body comprised on insulative material;

a plurality of pads mounted along a first and a second edge of said card; and a first and a second circuit unit mounted on said card body and connected to pads mounted along said first and second edges, said first and second circuit units being connected to pads mounted on said first edge such that upon insertion of said first edge into a first card socket, said first and second circuit units are enabled, and at least said second circuit unit also being connected to the pads mounted on said second edge such that upon insertion of said second edge into a second card socket, said second circuit unit alone is enabled, and said first circuit unit is a buffer circuit: and said buffer circuit is connected to said second circuit unit in a configuration such that, when said first edge is inserted in the first card socket, said buffer circuit is directly enabled from the circuit board to buffer signals therefrom and deliver them in a buffered condition to said second circuit.

23. The computer of claim 22 wherein:

said first circuit unit is a clocked register circuit; and said clocked register circuit is connected to said second circuit unit in a configuration such that, when said first edge is inserted in the first card socket, said clocked register circuit is directly enabled from the circuit board to transmit signals therefrom and deliver them to said second circuit.

24. The computer of claim 22 wherein:

said first circuit unit is a series pass circuit; and said series pass circuit is connected to said second circuit unit in a configuration such that, when said first edge is inserted in the first card socket, said series pass circuit is directly enabled from the circuit board to transmit signals therefrom and deliver them to said second circuit.

* * * * *